United States Patent [19]
Friedrich et al.

[11] Patent Number: 5,477,147
[45] Date of Patent: Dec. 19, 1995

[54] SHEATH WAVE BARRIER

[75] Inventors: Axel Friedrich, Nuremberg; Ludwig Kreischer, Dormitz, both of Germany

[73] Assignee: Siemens Aktiengesellschaft, Munich, Germany

[21] Appl. No.: 405,844

[22] Filed: Mar. 17, 1995

[30] Foreign Application Priority Data

May 25, 1994 [DE] Germany .................... 44 18 202.3

[51] Int. Cl.⁶ ......................................... G01V 3/00
[52] U.S. Cl. ................................... 324/322; 324/318
[58] Field of Search ............................... 324/322, 318,
324/314, 307, 309; 128/653.5; 333/206,
160, 222, 81 A

[56] References Cited

U.S. PATENT DOCUMENTS

| | | | |
|---|---|---|---|
| 2,278,238 | 3/1942 | Bushbeck | 333/222 |
| 4,682,125 | 7/1987 | Harrison et al. | 324/318 |
| 4,922,204 | 5/1990 | Duerr et al. | 324/322 |
| 5,371,466 | 12/1994 | Arakawa et al. | 324/318 |
| 5,376,885 | 12/1994 | Arakawa et al. | 324/318 |
| 5,418,509 | 5/1995 | Piirainen | 333/206 |

*Primary Examiner*—Louis M. Arana
*Attorney, Agent, or Firm*—Hill, Steadman & Simpson

[57] ABSTRACT

In a sheath wave barrier, a winding composed of coaxial line is wound in the form of a spiral around an axis. Respective layers of an electrically conductive material that cover both the top and bottom of the spiral winding are respectively disposed at axial spacings from the winding.

8 Claims, 1 Drawing Sheet

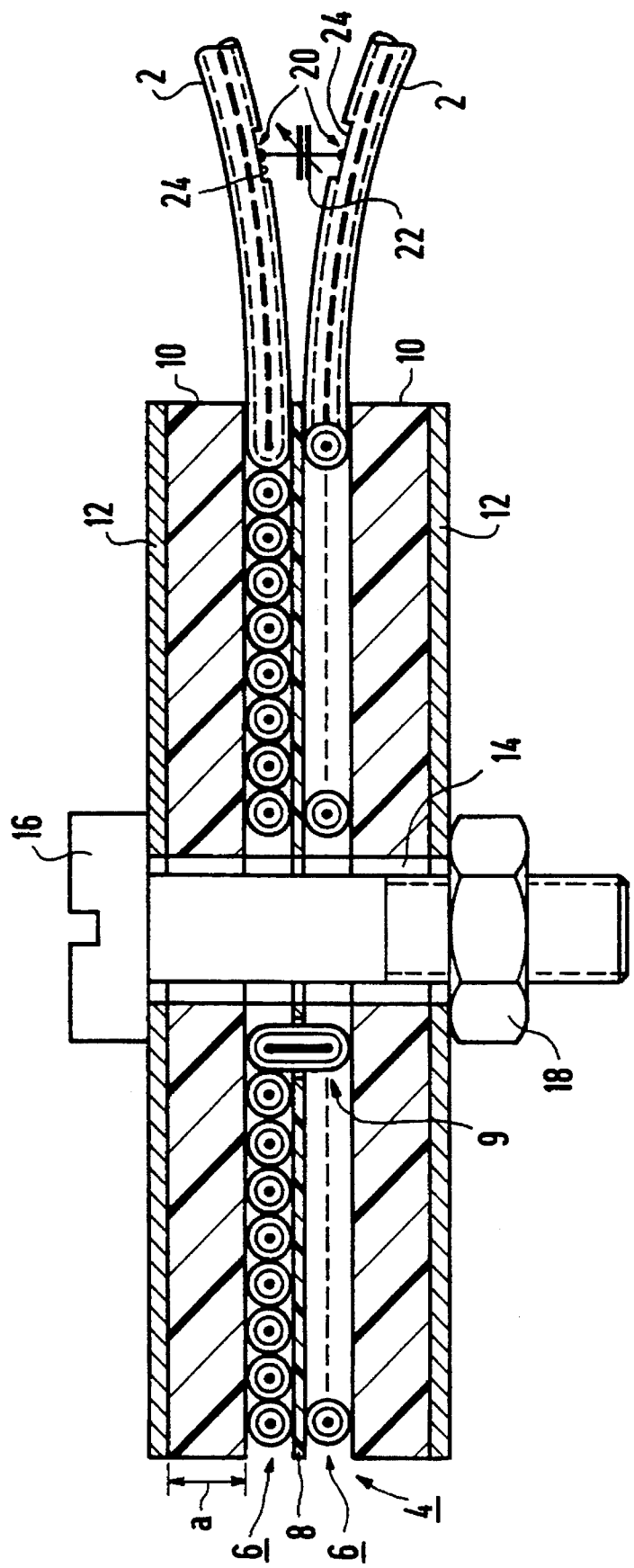

SHEATH WAVE BARRIER

BACKGROUND OF THE INVENTION

1. Field of the Invention

The invention is directed to a sheath wave barrier (also sometimes referred to as a sheath wave trap), preferably for employment in a feeder of a local antenna of a magnetic resonance apparatus having a winding composed ,of a coaxial line.

2. Description of the Prior Art

Sheath wave barriers prevent an infeed of external high-frequency fields onto the outer conductor of a signal line that is unbalanced to ground, for example, a coaxial line. The external fields can be coupled-in from a symmetrical antenna connected to the line or from other transmission antennas. Sheath wave barriers must therefore also be utilized in feeders to local antennas in a diagnostic magnetic resonance apparatus.

German OS 38 11 983, corresponding to U.S. Pat. No. 4,922,204, discloses a sheath wave barrier of the type described above. The inductance of the sheath wave barrier is fashioned as a toroid, whereby the winding is composed of a coaxial line. Even though the external dimensions of the sheath wave barrier can be made smaller by employing a highly permeable ferrite core, it would be desirable to make the outside dimensions of the sheath wave barrier even smaller. The risk of coupling external fields into the sheath wave barrier is thereby further reduced. The relatively high manufacturing outlay caused by the toroidal form of the winding is also a disadvantage.

SUMMARY OF THE INVENTION

An object of the present invention is to provide a sheath wave barrier having high blocking resistance, high electric strength and low volume that can be simply and ruggedly constructed.

This object is achieved in a sheath wave barrier constructed in accordance with the principles of the present invention wherein the winding is in the form of a spiral wound around an axis and respective layers of electrically conductive material covers the spiral winding at both sides of the spiral winding, the layers each disposed at an axial distance from the winding. A relatively high inductance and capacitance can be achieved with such a structure of a sheath wave barrier, so that the sheath wave barrier can be operated at its natural resonant frequency. The helically implemented winding achieves a simply constructed shielding that protects the sheath wave barrier against the entry of external fields and simultaneously prevents the emergence of fields. A simple and rugged structure is thereby also achieved.

In an embodiment the winding has a plurality of layers or plies have a defined spacing from one another, so that fluctuations in the electrical properties caused by manufacturing tolerances are slight.

In a further embodiment a balance capacitor electrically in parallel with the winding is electrically connected to an outer conductor of the coaxial line. The natural resonance of the sheath wave barrier lies somewhat higher than the operating or working frequency if there is no balance capacitor. Only an extremely small capacitance, however, is required for an exact balancing, so that the overall sheath wave barrier can still be constructed small and compact.

In another embodiment the electrically conductive layers are formed by two printed circuit boards metallized on one side, with the electrically conductive layers facing away from the winding and outwardly. Given the frequencies occurring in a magnetic resonance apparatus, the sheath wave barrier can be constructed such that further spacers for the electrically conductive layers can he foregone. A structure that is simplified further is thus achieved.

When, in another embodiment, the coaxial line is surrounded by an insulation, then the turns in the winding can immediately adjoin one another.

DESCRIPTION OF THE DRAWING

The single FIGURE is a side view, partly in section, of a sheath wave barrier constructed in accordance with the principles of the present invention.

DESCRIPTION OF THE PREFERRED EMBODIMENTS

In a partial sectional view, FIG. 1 shows a side view of the sheath wave barrier of the invention. It is especially adapted for insertion into a feeder 2, that is unbalanced to ground, of a local antenna (not shown), that is balanced to ground, in a diagnostic magnetic resonance apparatus having an operating frequency of approximately 60 MHz. The feeder 2 is composed of an insulated coaxial line having a diameter of approximately 1 mm that merges into a winding 4. The winding 4 is implemented in the form of a spiral (when viewed from above or below) in two layers or plies 6 that each have nine turns around an axis. The winding direction is the same in both layers or plies 6. The two layers or plies 6 of the winding 4 are separated from one another by a thin, round insulating grommet 8 so that the turns are respectively fixed in each layer or ply. The connection from the first layer or ply 6 to the second layer or ply 6 ensues at the inner, smallest turn 9 of the winding 4.

Respective, circular printed circuit boards 10 immediately adjoin the turns of the winding 4 in the axial direction at both the top and bottom of the winding 4. The printed circuit boards 10 are laminated on one side with a copper layer 12, both of these layers 12 facing away from the winding 4 and facing outwardly. The thickness of the printed circuit boards 10 essentially defines the axial spacing a at which the copper layer 12 is disposed from the winding 4. The spacing a is set such that, first, the shielding effect of the copper layer 12 prevents external fields from being coupled into the winding 4. Second, the spacing a is also not excessively small since the quality of the sheath wave barrier would otherwise decrease greatly because of currents induced in the copper layer 12.

A central through opening 14 serves the purpose of accepting a plastic screw 16 that, together with a plastic nut 18, serves as a clamp element that compresses and fixes the printed circuit boards 10 and the intervening winding 4, including the insulating grommet 8.

The insulation of the coaxial line is partially removed in a small area 20 in the immediate proximity of the winding 4 so that a balance capacitor 22 can be soldered to the outer conductor 24 in parallel with the winding 4.

Although modifications and changes may be suggested by those skilled in the art, it is the intention of the inventors to embody within the patent warranted hereon all changes and modifications as reasonably and properly come within the scope of their contribution to the art.

We claim as our invention:

1. A sheath wave barrier comprising:

a coaxial cable formed into a spiral winding around an axis, said spiral winding having a top and a bottom; and first and second layers of electrically conductive material respectively covering said top and bottom of said spiral winding and each disposed at an axial spacing from said winding.

2. A sheath wave barrier as claimed in claim 1 wherein said spiral winding comprises a plurality of layers of said coaxial cable, each layer being spirally wound in the same direction around said axis, and further comprising an electrically insulating grommet disposed between said layers.

3. A sheath wave barrier as claimed in claim 1 wherein said coaxial cable has an outer conductor, and further comprising a balance capacitor electrically connected to said outer conductor in parallel with said winding.

4. A sheath wave barrier as claimed in claim 1 further comprising first and second printed circuit boards respectively disposed adjacent said top and bottom of said spiral winding, each printed circuit board having a first side facing said spiral winding and a second side facing away from said spiral winding, and each printed circuit board having a metallization on the second side thereof comprising said layer of electrically conductive material.

5. A sheath wave barrier as claimed in claim 4 further comprising clamping means for holding said first and second printed circuit boards together with said spiral winding therebetween.

6. A sheath wave barrier as claimed in claim 4 wherein the respective first sides of said printed circuit boards are in direct contact with said top and bottom of said spiral winding.

7. A sheath wave barrier as claimed in claim 1 wherein said coaxial cable comprises an exterior electrical insulation.

8. A sheath wave barrier as claimed in claim 7 wherein said spiral winding comprises a plurality of turns, with adjacent turns being in direct contact with each other.

* * * * *